(12) United States Patent
Neo et al.

(10) Patent No.: US 7,691,680 B2
(45) Date of Patent: Apr. 6, 2010

(54) METHOD OF FABRICATING MICROELECTRONIC COMPONENT ASSEMBLIES EMPLOYING LEAD FRAMES HAVING REDUCED-THICKNESS INNER LENGTHS

(75) Inventors: Chee Peng Neo, Singapore (SG); Hock Chuan Tan, Singapore (SG); Beng Chye Chew, Singapore (SG); Yih Ming Chai, Singapore (SG); Kian Shing Tan, Singapore (SG)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 12/108,396

(22) Filed: Apr. 23, 2008

(65) Prior Publication Data

US 2008/0233684 A1 Sep. 25, 2008

Related U.S. Application Data

(62) Division of application No. 10/920,117, filed on Aug. 17, 2004, now Pat. No. 7,425,470, which is a division of application No. 10/425,538, filed on Apr. 28, 2003, now Pat. No. 7,057,281.

(30) Foreign Application Priority Data

Mar. 4, 2003 (SG) ............................. 200301338-0

(51) Int. Cl.
*H01L 21/00* (2006.01)
*H01L 23/495* (2006.01)
*H01R 43/00* (2006.01)
*H05K 3/02* (2006.01)

(52) U.S. Cl. .................... 438/123; 438/127; 29/827; 29/855; 257/674; 257/735; 257/775; 361/813

(58) Field of Classification Search ....................... None
See application file for complete search history.

(56) References Cited

U.S. PATENT DOCUMENTS 4,968,315 A 11/1990 Gatturna (Continued)

FOREIGN PATENT DOCUMENTS

EP 0 204 102 A2 12/1986

(Continued)

OTHER PUBLICATIONS

Hmiel, A. F. et al., "A Novel Process for Protecting Wire Bonds From Sweep During Molding", 8 pages, International Electronics Manufacturing Technology Symposium, Jul. 17-18, 2002, IEEE.

(Continued)

*Primary Examiner*—Alonzo Chambliss
(74) *Attorney, Agent, or Firm*—Perkins Coie LLP

(57) ABSTRACT

The present disclosure suggests various microelectronic component assembly designs and methods for manufacturing microelectronic component assemblies. In one particular implementation, a microelectronic component assembly includes a microelectronic component, at least two leads, and at least two bond wires. Each of the leads may have a reduced-thickness inner length adjacent terminals of the microelectronic component and a body having an outer surface spaced farther from the microelectronic component than a bond surface of the inner length. Each of the bond wires couples the microelectronic component to one of the leads and has a maximum height outwardly from the microelectronic component that is no greater than the height of the outer surface of the lead.

19 Claims, 6 Drawing Sheets

U.S. PATENT DOCUMENTS

| | | | |
|---|---|---|---|
| 4,996,629 | A | 2/1991 | Christiansen et al. |
| 5,041,901 | A | 8/1991 | Kitano et al. |
| 5,062,565 | A | 11/1991 | Wood et al. |
| 5,128,831 | A | 7/1992 | Fox, III et al. |
| 5,145,099 | A | 9/1992 | Wood et al. |
| 5,153,981 | A | 10/1992 | Soto |
| 5,252,857 | A | 10/1993 | Kane et al. |
| 5,296,744 | A | 3/1994 | Liang et al. |
| 5,311,057 | A | 5/1994 | McShane |
| 5,359,227 | A | 10/1994 | Liang et al. |
| 5,518,957 | A | 5/1996 | Kim |
| 5,561,329 | A * | 10/1996 | Mine et al. .................. 257/788 |
| 5,593,927 | A | 1/1997 | Farnworth et al. |
| 5,677,566 | A | 10/1997 | King et al. |
| 5,696,033 | A | 12/1997 | Kinsman |
| 5,714,800 | A | 2/1998 | Thompson |
| 5,735,030 | A | 4/1998 | Orcutt |
| 5,739,585 | A | 4/1998 | Akram et al. |
| D394,844 | S | 6/1998 | Farnworth et al. |
| 5,818,698 | A | 10/1998 | Corisis |
| 5,826,628 | A | 10/1998 | Hamilton |
| 5,834,831 | A | 11/1998 | Kubota et al. |
| D402,638 | S | 12/1998 | Wood et al. |
| 5,851,845 | A | 12/1998 | Wood et al. |
| 5,879,965 | A | 3/1999 | Jiang et al. |
| 5,883,426 | A | 3/1999 | Tokuno et al. |
| 5,891,753 | A | 4/1999 | Akram |
| 5,891,797 | A | 4/1999 | Farrar |
| 5,893,726 | A | 4/1999 | Farnworth et al. |
| 5,894,218 | A | 4/1999 | Farnworth et al. |
| 5,898,224 | A | 4/1999 | Akram |
| 5,933,713 | A | 8/1999 | Farnworth |
| 5,938,956 | A | 8/1999 | Hembree et al. |
| 5,946,553 | A | 8/1999 | Wood et al. |
| 5,958,100 | A | 9/1999 | Farnworth et al. |
| 5,986,209 | A | 11/1999 | Tandy |
| 5,989,941 | A | 11/1999 | Wensel |
| 5,990,566 | A | 11/1999 | Farnworth et al. |
| 5,994,784 | A | 11/1999 | Ahmad |
| RE36,469 | E | 12/1999 | Wood et al. |
| 5,998,860 | A | 12/1999 | Chan et al. |
| 6,008,070 | A | 12/1999 | Farnworth |
| 6,008,074 | A | 12/1999 | Brand |
| 6,018,249 | A | 1/2000 | Akram et al. |
| 6,020,624 | A | 2/2000 | Wood et al. |
| 6,020,629 | A | 2/2000 | Farnworth et al. |
| 6,025,728 | A | 2/2000 | Hembree et al. |
| 6,028,365 | A | 2/2000 | Akram et al. |
| 6,046,496 | A | 4/2000 | Corisis et al. |
| 6,048,744 | A | 4/2000 | Corisis et al. |
| 6,048,755 | A | 4/2000 | Jiang et al. |
| 6,049,125 | A | 4/2000 | Brooks et al. |
| 6,049,129 | A | 4/2000 | Yew et al. |
| 6,051,878 | A | 4/2000 | Akram et al. |
| 6,064,194 | A | 5/2000 | Farnworth et al. |
| 6,072,233 | A | 6/2000 | Corisis et al. |
| 6,072,236 | A | 6/2000 | Akram et al. |
| 6,075,288 | A | 6/2000 | Akram |
| 6,087,203 | A | 7/2000 | Eng et al. |
| 6,087,722 | A | 7/2000 | Lee et al. |
| 6,089,920 | A | 7/2000 | Farnworth et al. |
| 6,097,087 | A | 8/2000 | Farnworth et al. |
| 6,103,547 | A | 8/2000 | Corisis et al. |
| 6,107,122 | A | 8/2000 | Wood et al. |
| 6,107,680 | A | 8/2000 | Hodges |
| 6,117,382 | A | 9/2000 | Thummel |
| 6,124,634 | A | 9/2000 | Akram et al. |
| 6,130,474 | A | 10/2000 | Corisis |
| 6,133,068 | A | 10/2000 | Kinsman |
| 6,133,622 | A | 10/2000 | Corisis et al. |
| 6,137,162 | A | 10/2000 | Park et al. |
| 6,148,509 | A | 11/2000 | Schoenfeld et al. |
| 6,150,710 | A | 11/2000 | Corisis |
| 6,150,717 | A | 11/2000 | Wood et al. |
| 6,153,924 | A | 11/2000 | Kinsman |
| 6,159,764 | A | 12/2000 | Kinsman et al. |
| 6,172,419 | B1 | 1/2001 | Kinsman |
| 6,175,149 | B1 | 1/2001 | Akram |
| 6,184,465 | B1 | 2/2001 | Corisis |
| 6,188,232 | B1 | 2/2001 | Akram et al. |
| 6,198,172 | B1 | 3/2001 | King et al. |
| 6,201,304 | B1 | 3/2001 | Moden |
| 6,208,519 | B1 | 3/2001 | Jiang et al. |
| 6,210,992 | B1 | 4/2001 | Tandy et al. |
| 6,212,767 | B1 | 4/2001 | Tandy |
| 6,214,716 | B1 | 4/2001 | Akram |
| 6,215,175 | B1 | 4/2001 | Kinsman |
| 6,218,202 | B1 | 4/2001 | Yew et al. |
| 6,225,689 | B1 | 5/2001 | Moden et al. |
| 6,228,548 | B1 | 5/2001 | King et al. |
| 6,229,202 | B1 | 5/2001 | Corisis |
| 6,232,666 | B1 | 5/2001 | Corisis et al. |
| 6,235,554 | B1 | 5/2001 | Akram et al. |
| 6,239,489 | B1 | 5/2001 | Jiang |
| 6,246,108 | B1 | 6/2001 | Corisis et al. |
| 6,246,110 | B1 | 6/2001 | Kinsman et al. |
| 6,247,629 | B1 | 6/2001 | Jacobson et al. |
| 6,249,052 | B1 | 6/2001 | Lin |
| 6,252,308 | B1 | 6/2001 | Akram et al. |
| 6,252,772 | B1 | 6/2001 | Allen |
| 6,255,720 | B1 | 7/2001 | Courtenay |
| 6,258,623 | B1 | 7/2001 | Moden et al. |
| 6,258,624 | B1 | 7/2001 | Corisis |
| 6,259,153 | B1 | 7/2001 | Corisis |
| 6,261,865 | B1 | 7/2001 | Akram |
| 6,265,766 | B1 | 7/2001 | Moden |
| 6,271,580 | B1 | 8/2001 | Corisis |
| 6,277,671 | B1 | 8/2001 | Tripard |
| 6,281,042 | B1 | 8/2001 | Ahn et al. |
| 6,281,577 | B1 | 8/2001 | Oppermann et al. |
| 6,284,571 | B1 | 9/2001 | Corisis et al. |
| 6,285,204 | B1 | 9/2001 | Farnworth |
| 6,291,894 | B1 | 9/2001 | Farnworth et al. |
| 6,294,825 | B1 | 9/2001 | Bolken et al. |
| 6,294,839 | B1 | 9/2001 | Mess et al. |
| 6,297,547 | B1 | 10/2001 | Akram |
| 6,303,981 | B1 | 10/2001 | Moden |
| 6,303,985 | B1 | 10/2001 | Larson et al. |
| 6,310,390 | B1 | 10/2001 | Moden |
| 6,314,639 | B1 | 11/2001 | Corisis |
| 6,316,285 | B1 | 11/2001 | Jiang et al. |
| 6,326,242 | B1 | 12/2001 | Brooks et al. |
| 6,326,244 | B1 | 12/2001 | Brooks et al. |
| 6,326,687 | B1 | 12/2001 | Corisis |
| 6,326,697 | B1 | 12/2001 | Farnworth |
| 6,326,698 | B1 | 12/2001 | Akram |
| 6,329,220 | B1 | 12/2001 | Bolken et al. |
| 6,329,222 | B1 | 12/2001 | Corisis et al. |
| 6,329,705 | B1 | 12/2001 | Ahmad |
| 6,331,221 | B1 | 12/2001 | Cobbley |
| 6,331,448 | B1 | 12/2001 | Ahmad |
| 6,331,453 | B1 | 12/2001 | Bolken et al. |
| 6,332,766 | B1 | 12/2001 | Thummel |
| 6,344,976 | B1 | 2/2002 | Schoenfeld et al. |
| 6,365,434 | B1 | 4/2002 | Rumsey et al. |
| 6,385,049 | B1 | 5/2002 | Chia-Yu et al. |
| 6,387,729 | B2 | 5/2002 | Eng et al. |
| 6,420,782 | B1 | 7/2002 | Eng et al. |
| 6,429,528 | B1 | 8/2002 | King et al. |
| 6,437,586 | B1 | 8/2002 | Robinson |
| 6,441,501 | B1 | 8/2002 | Tseng et al. |
| 6,451,709 | B1 | 9/2002 | Hembree |
| 6,483,044 | B1 | 11/2002 | Ahmad |
| 6,521,993 | B2 | 2/2003 | Masayuki et al. |

| | | |
|---|---|---|
| 6,548,376 B2 | 4/2003 | Jiang |
| 6,548,757 B1 | 4/2003 | Russell et al. |
| 6,552,910 B1 | 4/2003 | Moon et al. |
| 6,558,600 B1 | 5/2003 | Williams et al. |
| 6,560,117 B2 | 5/2003 | Moon |
| 6,561,479 B1 | 5/2003 | Eldridge |
| 6,564,979 B2 | 5/2003 | Savaria |
| 6,576,494 B1 | 6/2003 | Farnworth |
| 6,576,495 B1 | 6/2003 | Jiang et al. |
| 6,589,820 B1 | 7/2003 | Bolken |
| 6,590,281 B2 | 7/2003 | Wu et al. |
| 6,607,937 B1 | 8/2003 | Corisis |
| 6,614,092 B2 | 9/2003 | Eldridge et al. |
| 6,622,380 B1 | 9/2003 | Grigg |
| 6,638,595 B2 | 10/2003 | Rumsey et al. |
| 6,644,949 B2 | 11/2003 | Rumsey et al. |
| 6,650,013 B2 | 11/2003 | Yin et al. |
| 6,653,173 B2 | 11/2003 | Bolken |
| 6,656,769 B2 | 12/2003 | Lee et al. |
| 6,661,104 B2 | 12/2003 | Jiang et al. |
| 6,664,139 B2 | 12/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,841,863 B2 | 1/2005 | Baik et al. |
| 7,057,281 B2 | 6/2006 | Peng et al. |
| 7,250,328 B2 | 7/2007 | Seng et al. |
| 7,425,470 B2 * | 9/2008 | Peng et al. .................. 438/123 |
| 2001/0050417 A1 | 12/2001 | Courtenay |
| 2003/0127712 A1 | 7/2003 | Murakami et al. |
| 2005/0012185 A1 | 1/2005 | Peng et al. |
| 2006/0208366 A1 | 9/2006 | Seng et al. |
| 2006/0231941 A1 | 10/2006 | Huang et al. |

FOREIGN PATENT DOCUMENTS

| | | |
|---|---|---|
| EP | 0 240 433 A2 | 10/1987 |
| EP | 0 753 891 A2 | 1/1997 |
| EP | 0 849 794 A1 | 6/1998 |
| EP | 0921569 A1 | 6/1999 |
| JP | 01309357 A | 12/1989 |
| JP | 200307032 | 11/2000 |
| WO | 02/082527 A1 | 10/2002 |

OTHER PUBLICATIONS

Chylak, B. et al., "Overcoming the Key Barriers in 35 μm Pitch Wire Bond Packaging: Probe, Mold, and Substrate Solutions and Trade-offs", 6 pages, International Electronics Manufacturing Technology Symposium, Jul. 17-18, 2002, IEEE.

Kulicke & Sofia, NoSWEEP® Wire Bond Encapsulant, 1 page, retrieved from the Internet on Jan. 2, 2003, <http://www.kns.com/prodserv/Polymers/NoSweep.asp>.

* cited by examiner

METHOD OF FABRICATING MICROELECTRONIC COMPONENT ASSEMBLIES EMPLOYING LEAD FRAMES HAVING REDUCED-THICKNESS INNER LENGTHS

CROSS-REFERENCE TO RELATED APPLICATION

This application claims foreign priority benefits of Singapore Application No. 200301338-0 filed Mar. 4, 2003, the entirety of which is incorporated herein by reference.

TECHNICAL FIELD

The present invention relates to microelectronic component assemblies. In particular, aspects of the invention relate to microelectronic component assemblies employing lead frames and methods of manufacturing microelectronic component assemblies employing such lead frames. Certain embodiments of the invention provide packaged microelectronic component assemblies.

BACKGROUND

Semiconductor chips or dies typically are manufactured from a semiconductor material such as silicon, germanium, or gallium/arsenide. An integrated circuit or other active feature(s) is incorporated in the die adjacent one surface, often referred to as the "active surface," of the die. The active surface typically also includes input and output terminals to facilitate electrical connection of the die with another microelectronic component.

Since semiconductor dies can be degraded by exposure to moisture and other chemical attack, most dies are encapsulated in a package that protects the dies from the surrounding environment. The packages typically include leads or other connection points that allow the encapsulated die to be electrically coupled to another electronic component, e.g., a printed circuit board. Typically, the leads extend laterally outwardly in a flat array that is part of a lead frame. Leaded packages include a semiconductor die, which may be attached to the lead frame either by seating the die on a die paddle or attaching the die directly to the leads, e.g., via a die attach adhesive in a leads-on-chip attachment. Some or all of the terminals of the semiconductor die then may be electrically be connected to leads of the lead frame, e.g., by wire bonding. The connected lead frame and die may then be encapsulated in a mold compound to complete the packaged microelectronic component assembly. The leads extend outwardly from the mold compound, allowing the features of the semiconductor die to be electrically accessed. Finally, the lead frame will be trimmed and formed into a desired configuration of electrically independent leads.

FIG. 1 schematically illustrates a conventional packaged microelectronic component assembly 10. This microelectronic component assembly 10 includes a semiconductor die 20 having an active surface, which bears an array of terminals 24, and a back surface 26. This microelectronic component assembly 10 is a conventional leads-on-chip package with a plurality of leads 30a and 30b attached to the active surface 22 of the die 20 by adhesive members 35a and 35b. Typically, the inner length 32a of each of a series of first leads 30a will be attached to a first adhesive member 35a. The inner length 32b of each of a set of second leads 30b are attached to the die 20 by a second adhesive member 35b. The inner ends of the first leads 30a may be spaced from the inner ends of the second leads 30b. This defines a terminal gap 34 between the ends of the leads 30 through which the terminals 24 of the die 20 can be accessed by a wire bonding machine or the like.

The microelectronic component assembly 10 also includes a plurality of bond wires 40. A first set of bond wires 40a may extend from individual terminals 24 of the die 20 to the inner ends 32a of the first leads 30a. Similarly, a series of second bond wires 40b may extend from other terminals 24 in the terminal array to the inner ends 32b of the second leads 30b. Typically, these bond wires 40 are attached using wire bonding machines that spool a length of wire through a capillary. A molten ball may be formed at a protruding end of the wire and the capillary may push this molten ball against one of the terminals 24, thereby attaching the terminal end 42 of the wire 40 to the die 20. The capillary will then be moved laterally in a direction away from the lead 30 to which the wire 40 will be attached (referred to as the reverse motion of the capillary) then a further length of the wire will be spooled out and the lead end 44 of the wire 40 will be attached to the inner end 32 of one of the leads 30. The reverse motion of the capillary is required to bend the wire into the desired shape to avoid undue stress at either the terminal end 42 or the lead end 44.

The need to move the capillary in the reverse direction to form the bend in the wire 40 requires significant clearance between the terminal end 42 and the inner ends of the leads 30. This increases the width W of the terminal gap 34. This, in turn, increases the length of each of the bond wires 40 and often requires an increased loop height L of the wire 40 outwardly from the active surface 22 of the die 20. By way of example, a conventional microelectronic component assembly 10 may include adhesive members 35 having a thickness of about 4 mils and a lead frame 30 having a lead frame of about 5 mils. In such a microelectronic component assembly 10, the width W of the terminal gap 34 commonly will be on the order of 100 mils (about 2.5 mm) or more. (FIG. 1 is merely a schematic illustration and is not drawn to scale; the thicknesses of many of the elements of the assembly 10 have been exaggerated for purposes of clarity.) Conventional wire bonding machines commonly yield a maximum loop height L in such an assembly 10 of about 10-14 mils.

As noted above, most commercial microelectronic component assemblies are packaged in a mold compound 50. The mold compound 50 typically encapsulates the die 20, the adhesive members 35, the bond wires 40, and the inner lengths 32 of the leads 30. A remainder of the leads 30 extends laterally outwardly from the sides of the mold compound 50. In many conventional applications, the mold compound 50 is delivered using transfer molding processes in which a molten dielectric compound is delivered under pressure to a mold cavity having the desired shape. In conventional side gate molds, the mold compound will flow from one side of the cavity to the opposite side. As the front of the molten dielectric compound flows along the terminal gap 34 under pressure, it will tend to deform the wires. This deformation, commonly referred to as "wire sweep," can cause adjacent wires 40 to abut one another, creating an electrical short. Wire sweep may also cause one of the wires 40 to bridge two adjacent leads, creating an electrical short between the two leads. These problems become more pronounced as the wire pitch becomes smaller and as thinner wires 40 are used. For example, the stiffness of a 20 μm diameter wire is only about 40% that of a 25 μm wire and a 15 μm diameter wire is only about 13% as stiff as a 25 μm wire. Since semiconductor dies 20 are continually decreasing in size and the terminals 24 are getting closer and closer to one another, wire sweep in conventional packaged microelectronic component assemblies 10 is likely to cause even more problems in the future.

DETAILED DESCRIPTION

A. Overview

Figure 1:
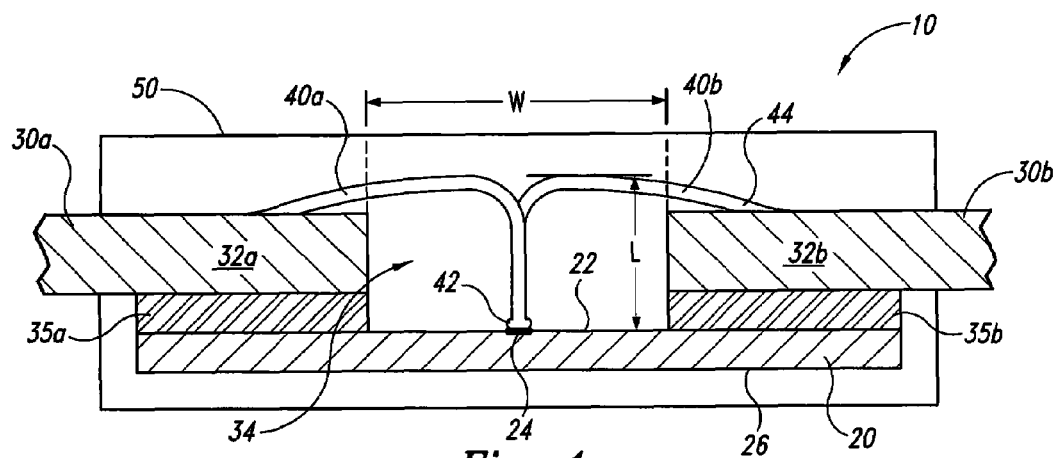
FIG. 1 is a schematic cross-sectional view of a conventional packaged microelectronic component assembly.

Various embodiments of the present invention provide various microelectronic component assemblies and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

A microelectronic component assembly in accordance with one embodiment includes a microelectronic component, at least two leads, and at least two bond wires. The microelectronic component has an active surface and an array of terminals carried on the active surface. The leads may be attached to the active surface of the microelectronic component, with each of the leads having an elongate body and a reduced-thickness inner length that is disposed adjacent the terminals of the microelectronic component. The body of each lead has a first thickness and an outer surface at a first height outwardly from the active surface of the microelectronic component. The inner length has a second thickness and a bond surface at a second height outwardly from the active surface of the microelectronic component. The first thickness is greater than the second thickness and the first height is greater than the second height. Each of the bond wires may 1) electrically couple one of the terminals of the microelectronic component to the bond surface of one of the leads, and 2) have a maximum height outwardly from the active surface of the microelectronic component that is no greater than the first height.

Another embodiment of the invention provides a method of manufacturing a microelectronic component assembly. In accordance with this method, an active surface of a microelectronic component is juxtaposed with first and second leads. Each of the first and second leads has a body having a first thickness and an inner length having a second thickness that is less than the first thickness. The first and second leads have inner ends opposed to one another across a terminal gap. The first and second leads may be attached to the active surface of the microelectronic component with a linear array of terminals carried by the active surface extending longitudinally through the terminal gap. The body of each of the first and second leads may have an outer surface adjacent its inner length that is spaced a body height outwardly from the active surface of the microelectronic component. A first bond wire may be attached to a first terminal of the array and to the inner length of the first lead and a second bond wire may be attached to a second terminal of the array and to the inner length of the second lead. The first and second bond wires may each have a maximum height outwardly from the active surface that is less than the body height.

A microelectronic component assembly in accordance with another embodiment comprises first and second microelectronic components; first, second, and third leads; and first, second, and third bond wires. The first microelectronic component has an active surface that carries a first terminal and a second terminal. Each of the first and second leads is attached to the active surface of the first microelectronic component and has an elongate body and a reduced-thickness inner length that is disposed adjacent the terminals of the microelectronic component. The body has an outer surface at a first height outwardly from the active surface of the first microelectronic component and the inner length has a bond surface at a second height outwardly from the active surface of the first microelectronic component. The first height is greater than the second height. The first bond wire electrically couples the first terminal to the bond surface of the first lead and the second bond wire electrically couples the second terminal to the bond surface of the second lead. Each of the first and second bond wires has a maximum height outwardly from the active surface of the first microelectronic component that is no greater than the first height. The second microelectronic component has a back surface oriented toward the active surface of the first microelectronic component and an active surface oriented away from the first microelectronic component. The second microelectronic component is attached to the outer surface of the body of each of the first and second leads. The third bond wire electrically couples a third terminal carried on the active surface of the second microelectronic component to the third lead.

Another embodiment of the invention provides a microelectronic component assembly that includes a microelectronic component, a set of first leads, a set of second leads, first and second bond wires, a dielectric matrix, and an array of conductive structures. The microelectronic component has an active surface carrying an array of terminals. Each of the first leads has an inner length adjacent the array of terminals and an elongate body extending laterally outward in a first direction from the inner length. Each of the second leads has an inner length adjacent the array of terminals and an elongate body extending laterally outward in a different second direction from the inner length. The body of each of the first and second leads has a first thickness and an outer surface at a first height outwardly from the active surface of the microelectronic component. The inner length of each of the first and second leads has a second thickness and a bond surface at a second height outwardly from the active surface of the microelectronic component. The first thickness is greater than the second thickness and the first height is greater than the second height. The first bond wire electrically couples a first terminal of the array of terminals to the bond surface of one of the first leads. The second bond wire electrically couples a second terminal of the array of terminals to the bond surface of one of the second leads. Each of the first and second bond wires has a maximum height outwardly from the active surface of the microelectronic component that is no greater than the first height. The dielectric matrix covers the first and second bond wires and at least a portion of the inner length of each of the first and second leads. The dielectric matrix may have a maximum height outwardly from the active surface of the microelectronic component that is no greater than the first height. Each of the conductive structures may be carried on and in electrical contact with the outer surface of the body of one of the first leads or one of the second leads.

A microelectronic component assembly in accordance with yet another embodiment of the invention includes a microelectronic component, at least two leads, and at least two bond wires. The microelectronic component has an active surface and an array of terminals carried on the active surface. The leads are attached to the active surface of the microelectronic component, with each of the leads having an elongate body, a reduced-thickness inner length that is disposed adjacent the terminals of the microelectronic component, and an intermediate length disposed between the body and the inner length. The body has a first thickness and an outer surface at a first height outwardly from the active surface of the microelectronic component. The intermediate length has a second thickness and an intermediate surface at a second height outwardly from the active surface of the microelectronic component. The inner length has a third thickness and a bond surface at a third height outwardly from the active surface of the microelectronic component. The second thickness is less than the first thickness but greater than the third thickness. The second height is less than the first height but greater than the third height. Each of the bond wires electrically couples one of the terminals of the microelectronic component to the bond surface of one of the leads. In one implementation, each bond wire has a maximum height outwardly from the active surface of the microelectronic component that is no greater than the second height.

Another embodiment of the invention provides a microelectronic component assembly that includes first and second microelectronic components, first and second leads, and first, second, and third bond wires. The first microelectronic component has an active surface that carries a first terminal and a second terminal. Each of the first and second leads is attached to the active surface of the first microelectronic component and has an elongate body, a reduced-thickness inner length, and an intermediate length. The elongate body of each of the leads has an outer surface at a first height outwardly from the active surface of the first microelectronic component. The inner length is disposed adjacent the terminals of the microelectronic component and has a bond surface at a second height outwardly from the active surface of the first microelectronic component. The first height is greater than the second height. The intermediate length of each of the leads is disposed between the body and the inner length of that lead. The intermediate length has a mounting surface at a third height outwardly from the active surface of the first microelectronic component. The third height is less than the first height but greater than the second height. The first bond wire electrically couples the first terminal to the bond surface of the first lead and the second bond wire electrically couples the second terminal to the bond surface of the second lead. The second microelectronic component has a back surface oriented toward the active surface of the first microelectronic component and an active surface oriented away from the first microelectronic component. The back surface of the second microelectronic component is attached to the mounting surface of the intermediate length of each of the first and second leads. The third bond wire electrically couples a third terminal carried on the active surface of the microelectronic component to a third lead.

For ease of understanding, the following discussion is subdivided into five areas of emphasis. The first section discusses microelectronic component assemblies employing reduced-thickness lead frames in accordance with selected embodiments of the invention. The second section describes aspects of microelectronic component assemblies having stacked microelectronic components in other embodiments of the invention. The third section discusses other microelectronic component assemblies employing reduced-thickness lead frames in accordance with selected alternative embodiments of the invention. The fourth section describes alternative microelectronic component assemblies having stacked microelectronic components. Finally, the fifth section outlines methods in accordance with other aspects of the invention.

B. Microelectronic Component Assemblies Employing Reduced-Thickness Lead Frames

Figure 2:
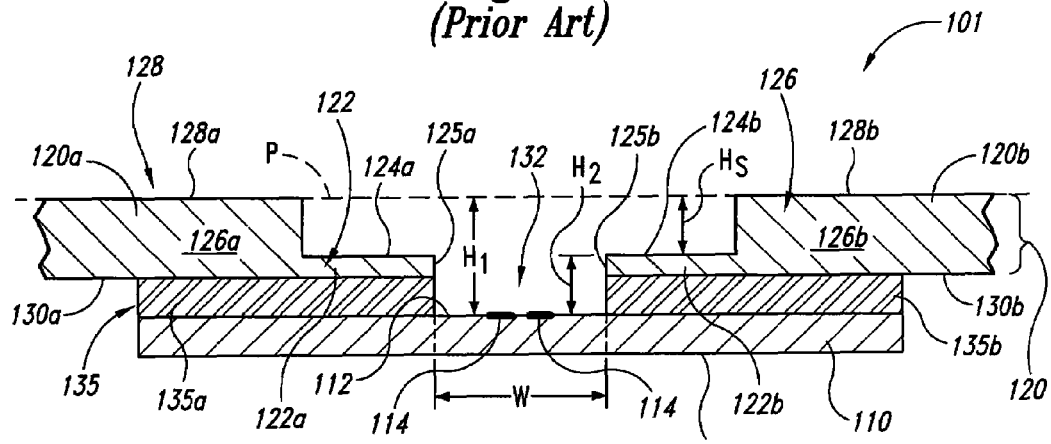
FIG. 2 is a schematic cross-sectional view of a microelectronic component subassembly in accordance with one embodiment of the invention.
Figure 3:
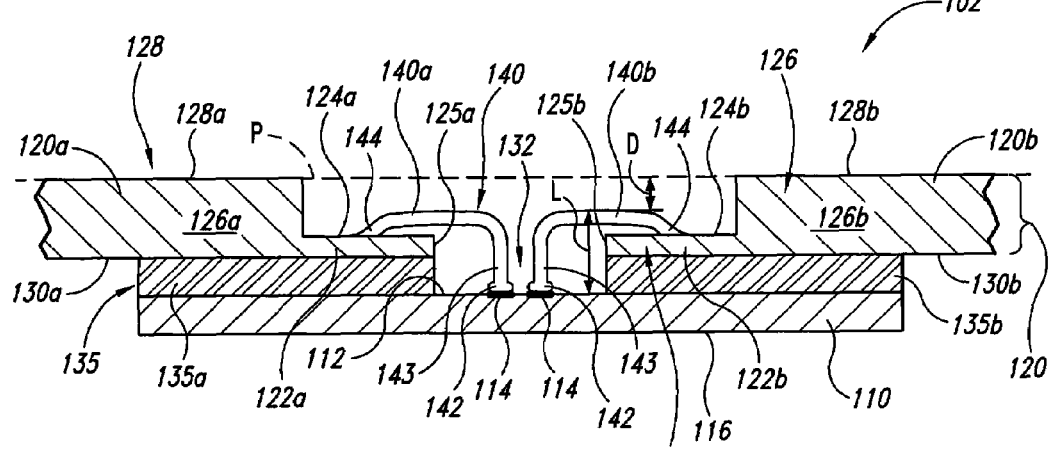
FIG. 3 is a schematic cross-sectional view of the microelectronic component subassembly of FIG. 2 after the addition of bonding wires.

FIGS. 2 and 3 schematically illustrate microelectronic component subassemblies in accordance with selected embodiments of the invention. These microelectronic components are referred to herein as subassemblies primarily because they are unlikely to be sold commercially in this fashion and instead represent an intermediate stage in the manufacture of a commercial device, e.g., the packaged microelectronic component assembly 100 of FIG. 4.

Turning first to FIG. 2, the microelectronic component subassembly 101 shown therein includes a microelectronic component 110 and a plurality of leads 120. The microelectronic component 110 has an active surface 112 and a back surface 116. The active surface 112 carries an array of terminals 114. In one embodiment (not shown), the terminals 114 are aligned along a longitudinal midline of the microelectronic component 110. In the illustrated embodiment, the terminals 114 are arranged in a longitudinally extending array in which the terminals 114 are staggered along either side the midline of the microelectronic component. As is known in the art, such a staggered arrangement can facilitate a smaller wire pitch, increasing the maximum number of terminals 114. Arrays in which the terminals 114 are more widely distributed on the active surface 112 may be used instead.

The microelectronic component 110 may comprise a single microelectronic component or a subassembly of separate microelectronic components. In the embodiment shown in FIG. 2, the microelectronic component 110 is typified as a single semiconductor die. In one particular implementation, the microelectronic component 110 comprises a memory element, e.g., SIMM, DRAM, or flash memory. In other implementations, the microelectronic component 110 may comprise an ASIC or a processor, for example.

During manufacture, the leads 120 may comprise a portion of a lead frame that includes dozens of leads, including a set of first leads 120a and a set of second leads 120b. The inner edges 125a of each of the first leads 120a may be aligned with one another at a location extending along one side of the array of terminals 114. The inner edges 125b of the second leads 120b likewise may be aligned with one another at a location extending along the opposite side of the array of terminals 114. This defines a terminal gap 132 between the aligned inner edges 125a of the first leads 120a and the aligned inner edges 125b of the second leads 120b. As explained below, aspects of the microelectronic component assembly 101 allow the width W of the terminal gap 132 to be substantially smaller than the terminal gap width W encountered in conventional designs such as that shown in FIG. 1.

Each of the leads 120 may be attached to the microelectronic component 110 by means of an adhesive member 135. In particular, a confronting surface 130a of each of the first leads 120a may be attached to the active surface 112 of the microelectronic component 110 by a first adhesive member 135a. Similarly, a confronting surface 130b of each of the second leads 120b may be attached to the active surface 112 of the microelectronic component 110 by a second adhesive member 135b. In one embodiment, each of the adhesive members 135 comprises a length of a conventional die attach tape, e.g., a polyimide film such as KAPTON. In another embodiment, each adhesive member 135 comprises a quantity of a thermoplastic resin or a curable epoxy.

Leads of conventional lead frames, e.g., the leads 30 in FIG. 1, typically have a constant thickness along their length. The leads 120 of FIG. 2 have a reduced-thickness inner length 122 and a body 126 that is thicker than the inner length 122. The lateral length of the inner length 122 can be varied significantly. In one embodiment, for example, each inner length extends a distance from the inner edge 125 to the body 126 of at least about 7 mils (about 175 μm) and may be one inch (about 25 mm) or longer.

The body 126a of each of the first leads 120a has an outer surface 128a spaced a first height $H_1$ from the active surface 112 of the microelectronic component 110. The body 126b of each of the second leads 120b may have an outer surface 128b that is spaced the same first height $H_1$ from the active surface 112. Hence, the outer surfaces 128 of the leads 120 may be generally coplanar within a common plane P spaced a height $H_1$ from the active surface 112. The inner length 122a of the first lead 120a has a bond surface 124a and the inner length 122b of each of the second leads 120b has a bond surface 124b. Each of the bond surfaces 124 may be positioned at a second height $H_2$ from the active surface 112. The first height $H_1$ is greater than the second height $H_2$, defining a step height $H_S$ between the bond surface 124 and the body outer surface 128 of each of the leads 120.

The relative dimensions of these heights $H_1$, $H_2$, and $H_S$ may be varied to meet the needs of a particular application. In the embodiments shown in FIG. 2, the first height $H_1$ is the sum of the thickness of the adhesive members 135 and the thickness of each of the lead bodies 126. In one particular implementation, the adhesive member 135 comprises a die attach tape having a thickness of about 2-5 mils, e.g., about 4 mils. The leads 120 may comprise part of a lead frame formed from a thin metal foil. Such lead frames typically have a thickness on the order of about 4-15 mils. In some embodiments of the invention, the thickness of the lead bodies 126 is toward the lower end of that range, e.g., about 4-8 mils. In one particular embodiment, the lead bodies 126 have a thickness of about 5 mils. When the leads 120 are attached to the microelectronic component 110 by the adhesive members 135, the resultant first height $H_1$ in certain embodiments is between about 6 mils and about 12 mils. In one particular implementation, the adhesive member 135 has a thickness of about 4 mils and the lead bodies 126 have a thickness of about 5 mils, yielding a first height $H_1$ of about 9 mils.

In one embodiment, the step height $H_S$ is at least about 1 mil (about 25 microns). The inner length 122 desirably has a thickness of at least about 2 mils (about 50 microns), so the step height $H_S$ may be about 2 mils less than the thickness of each lead body 126. In the exemplary embodiment noted above wherein the lead bodies 126 have a thickness of about 5 mils and the adhesive members 135 are about 4 mils thick, the step height $H_S$ may be about 3 mils, positioning the bond surfaces 124 of the inner lengths 122 at a second height $H_2$ of about 6 mils from the active surface 112. In one embodiment, the step height $H_S$ is 40% or more of the thickness of the lead body 126. In one particular embodiment, the step height $H_S$ is about 50-60% of the thickness of the lead body 126.

In the embodiment shown in FIG. 2, there is a sharp change in thickness where the lead body 126 adjoins the inner length 122. This is not necessary; a more gradual transition between the bonding surface 124 and the outer surface 128 can be used instead. The method in which the inner length 122 is provided with its reduced thickness is not material. The reduced-thickness inner length 122 may, for example, be created using conventional photomask/etch processes, machine tooling, or laser ablation.

FIG. 3 schematically illustrates a microelectronic component subassembly 102 that incorporates the microelectronic component subassembly 101 of FIG. 2. In particular, the device shown in FIG. 3 may comprise the microelectronic component subassembly 101 of FIG. 2 with two or more bond wires 140 attached thereto. In the cross-sectional view of FIG. 3, only two bond wires, a first bond wire 140a and a second bond wire 140b, are visible. The first bond wire 140a has a terminal end 142 bonded to one of the terminals 114 of the microelectronic component 110 and a lead end 144 attached to the bond surface 124a of the first lead 120a. The second bond wire 140b also has a terminal end 142 attached to one of the terminals 114 of the microelectronic component 110 and has a lead end 144 that is attached to the bond surface 124b of the second lead 120b. A terminal length 143 of each of the bond wires 140 may be positioned in the terminal gap 132 and extend outwardly from the active surface 112 of the microelectronic component 110.

In the subassembly 102 of FIG. 3, each of the bond wires 140 has a maximum height L outwardly from the active surface 112 that is no greater than the height ($H_1$ in FIG. 2) of the outer surfaces 128 of the leads 120. As a consequence, none of the bond wires 140 will extend outwardly beyond the common plane P of the outer surfaces 128 of the leads 120. In FIG. 3, the maximum height L of the bond wires 140 is no greater than the height $H_1$ of the common plane P, leaving the bond wires 140 spaced a distance D below this common plane P. In select embodiments, this distance D is about 0-3 mils (about 0-75 microns). In one particular embodiment, the distance D is about 2-3 mils (about 50-75 microns). In one particular embodiment, the step height $H_S$ is at least about two times the diameter of the bonding wires 140. It is believed that a step height $H_S$ of about 2-2.5 times the thickness of the bonding wire 140 will provide more than adequate manufacturing tolerances to ensure that the bond wires 140 do not extend outwardly beyond the common plane P of the outer surfaces 128 of the lead bodies 126.

Figure 4:
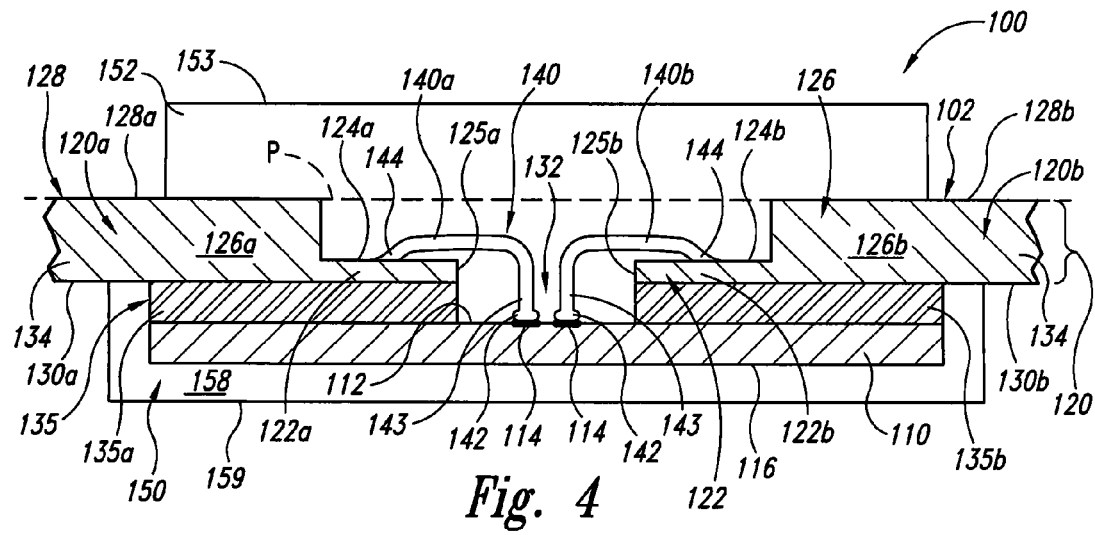
FIG. 4 is a schematic cross-sectional view of a packaged microelectronic component assembly in accordance with one embodiment of the invention that incorporates the microelectronic component subassembly of FIG. 3.

In accordance with different embodiments of the invention, a microelectronic component subassembly 102 such as that illustrated in FIG. 3 may be incorporated in different microelectronic component assemblies. FIG. 4 illustrates one particular microelectronic component assembly 100 that is manufactured from the microelectronic component subassembly 102 of FIG. 3. The microelectronic component assembly 100 also includes a dielectric matrix 150 that covers the bond wires 140, the microelectronic component 110, and a portion of each of the leads 120, leaving an exposed portion 134 of each of the leads 120 extending laterally outwardly from the dielectric matrix 150. In the illustrated embodiment, the dielectric matrix 150 includes a first portion 152 that defines a front surface 153 of the assembly 100 and a second portion 158 that defines a back surface 159 of the assembly 100. The first and second portions 152 and 158 may be formed during the same manufacturing step, e.g., in a single transfer molding operation. In another embodiment, the first portion 152 and the second portion 158 are formed in separate manufacturing steps.

The dielectric matrix 150 may be formed of any material that will provide suitable protection for the elements within the matrix 150. It is anticipated that most conventional, commercially available microelectronic packaging mold compounds may be useful as the dielectric matrix 150. Such mold compounds typically comprise a dielectric thermosetting plastic that can be heated to flow under pressure into a mold cavity of a transfer mold. In other embodiments, the dielectric matrix 150 may comprise a more flowable dielectric resin that can be applied by wicking under capillary action instead of delivered under pressure in a transfer mold.

As noted previously, terminal pitch and bond wire pitch in packaged microelectronic components (e.g., microelectronic component 10 of FIG. 1) are decreasing over time. The requisite smaller wire diameters and closer spacing exacerbates the previously-noted problems associated with wire sweep. The microelectronic component assembly 100 of FIG. 4 can reduce some of these problems. Having the bond surface 124 of the leads positioned closer to the active surface 112 of the microelectronic component 110 reduces the spacing necessary for the reverse motion of the capillary of a wire bonding machine. This, in turn, permits the opposed inner edges 125a and 125b to be positioned closer to one another, reducing the width (W in FIG. 2) of the terminal gap 132. In contrast to the conventional design of FIG. 1 with a terminal gap width W of 2.5 mm or more, the width W of the terminal gap 132 in FIGS. 2-4 may be 35 mils or less, e.g., 35 mils or less for 25 μm wires or 23 mils or less for 15 μm wires. Because the bond wires 140 need not extend outwardly from the active surface 112 as far or laterally as far to reach the bonding surface 124 of the leads, the length of each of the bonding wires 140 can be materially reduced. Wire sweep increases as the bonding wires become longer. Shortening the bond wires 140, therefore, will reduce the wire sweep encountered for bond wires 140 having the same diameter, or it may permit the use of thinner (and cheaper) bond wires 140 that experience about the same degree of wire sweep.

If the terminal gap 34 in a conventional microelectronic component assembly 10 has too small of a gap width W, the mold compound will have to be delivered at a higher molding pressure to ensure that the mold compound reaches all the way to the active surface 22. In the embodiment shown in FIG. 4, the terminal gap 132 has a depth equal to the height ($H_2$ in FIG. 2) of the bonding surfaces 124 from the active surface 112. This reduced depth reduces the resistance of flow of mold compound down to the active surface 112 of the microelectronic component 110. The terminal gap width W, therefore, can be reduced while still ensuring adequate fill of the terminal gap 132.

Figure 5:
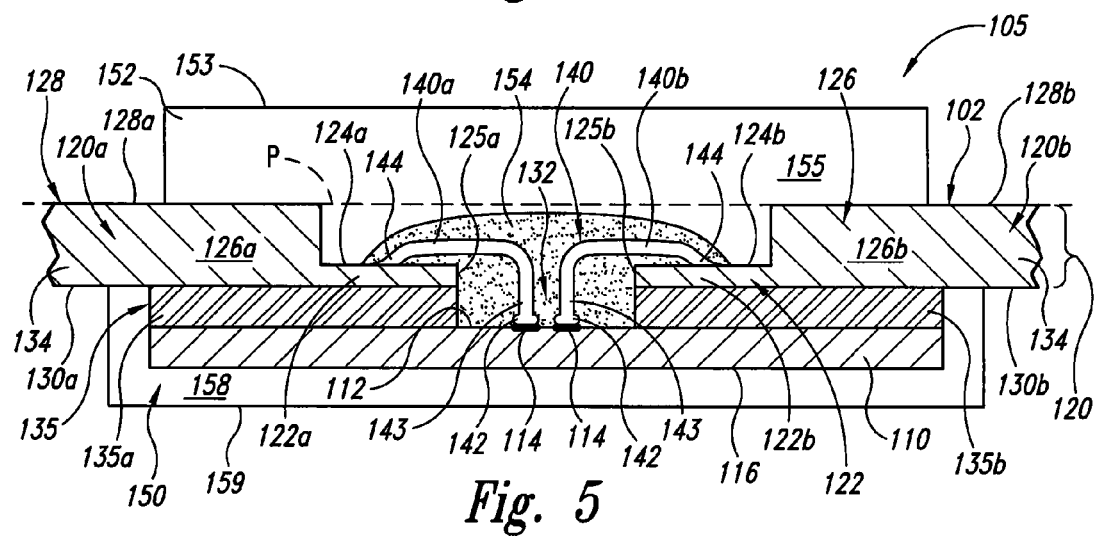
FIG. 5 is a schematic cross-sectional view of a packaged microelectronic component assembly in accordance with another embodiment of the invention that incorporates the microelectronic component subassembly of FIG. 3.

FIG. 5 schematically illustrates a microelectronic component assembly 105 in accordance with a further embodiment of the invention. Most of the elements of the microelectronic component assembly 105 may be the same as those illustrated in FIG. 4 and like reference numbers are used in FIGS. 4 and 5 to indicate like elements. The primary distinction between the microelectronic components 100 and 105 is that the first portion 152 of the dielectric matrix 150 shown in FIG. 4 may be integrally formed from a single material, whereas the first portion 152 of the dielectric matrix 150 in FIG. 5 has two distinct segments. In particular, the first portion 152 in FIG. 5 includes a dielectric wire encapsulant 154 and an outer mold compound 155. In one embodiment, the dielectric wire encapsulant 154 is applied on the microelectronic component assembly 102 of FIG. 3, then the outer mold compound 155 and the second portion 158 of the dielectric matrix 150 may be formed in a single transfer molding operation.

The dielectric wire encapsulant 154, if employed, desirably at least partially covers each of the bond wires 140. In the embodiment shown in FIG. 5, the dielectric wire encapsulant 154 substantially fills the terminal gap 132 and covers both the entire length of each of the bond wires 140 and a portion of the bond surface 124 of the lead inner lengths 122. The dielectric wire encapsulant 154 in this embodiment has a maximum height no greater than the height ($H_1$ in FIG. 2) of the outer surfaces 128 of the leads 120. This may reduce the likelihood of damage to the dielectric wire encapsulant 154 during subsequent manufacturing steps.

In another embodiment, the dielectric wire encapsulant 154 has a maximum height that is lower than that shown in FIG. 5 and is spaced below the common plane P of the outer surfaces 128. In one particular implementation (not specifically shown in FIG. 5), the dielectric wire encapsulant 154 covers the terminal length 143 of each of the bond wires 140, but leaves at least some of the bond wires 140 with an exposed length that is not covered by the dielectric wire encapsulant 154. In such an embodiment, the dielectric wire encapsulant 154 may not fill the terminal gap 132 and may even have a maximum height that is less than the height ($H_2$ in FIG. 2) of the bonding surfaces 124 of the leads 120.

In one embodiment, the dielectric wire encapsulant 154 is formed of a material that is different than the dielectric material that comprises the outer mold compound 155. The material selected for the dielectric wire encapsulant 154 may have a viscosity when initially applied that is less than the viscosity of the outer mold compound 155 when it is applied. In one particular implementation, the dielectric wire encapsulant 154 comprises a curable resin that can be applied at a lower viscosity to flow between and beneath the bond wires 140 and, if so desired, substantially fill the terminal gap 132, but can be hardened in a subsequent curing step. One such material is commercially available from Kulicke and Soffa of Willow Grove, Pa., U.S.A. under the trade name NOSWEEP.

Using a dielectric wire encapsulant 154 such as that described above can further reduce the problems associated with wire sweep. If the outer mold compound 155 is delivered under pressure in a transfer molding operation, for example, the dielectric wire encapsulant 154 will help stabilize the bond wires 140. In the embodiment shown in FIG. 5, the dielectric wire encapsulant 154 completely encapsulates the bond wires 140 so they will not be affected materially by the pressure of the transfer molding operation. If a portion of some or all of the bond wires 140 remains exposed, covering the terminal length 143 or other appropriate segment of each of the bond wires 140 still helps anchor the bond wires 140 in place and reduces the length of each of the bond wires 140 that may be subjected to strain as the front of the mold compound moves through the mold cavity.

Figure 6:
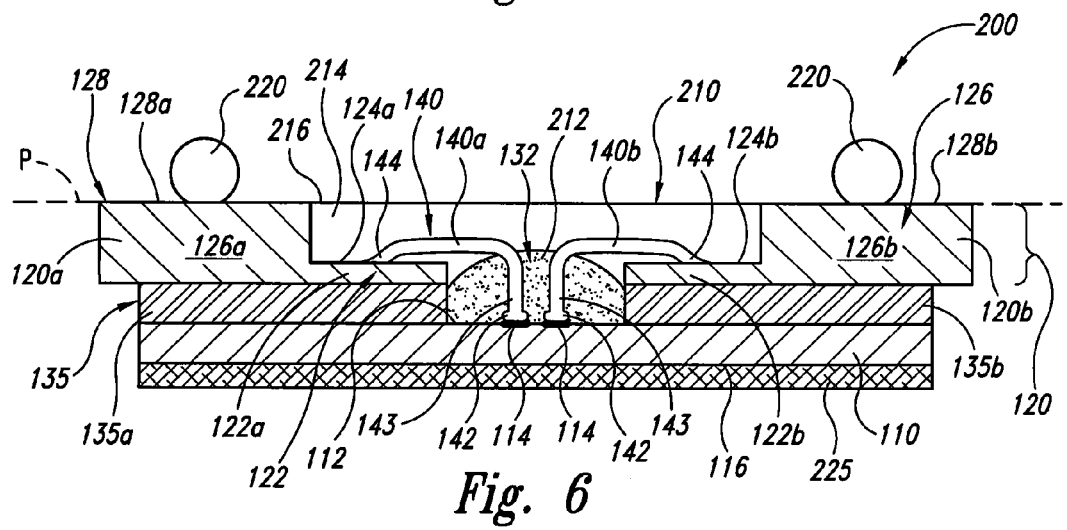
FIG. 6 is a schematic cross-sectional view of a microelectronic component assembly in accordance with yet another embodiment of the invention that incorporates the microelectronic component subassembly of FIG. 3.

FIG. 6 schematically illustrates a microelectronic component assembly 200 in accordance with another embodiment of the invention that may also employ the microelectronic component subassembly 102 shown in FIG. 3. This microelectronic component assembly 200 includes a dielectric matrix 210 that substantially fills the terminal gap 132 and covers the bond wires 140, the active surface 112 of the microelectronic component 110, and the bond surfaces 124 of the inner lengths 122. However, the remainder of each of the leads 120 and the remainder of the microelectronic component 110 may remain uncovered by the dielectric matrix 210. The dielectric matrix 210 may have a maximum height outwardly from the active surface 112 of the microelectronic component that is no greater than the height ($H_1$ in FIG. 2) of the outer surfaces 128 of the leads 120. In the particular implementation illustrated in FIG. 6, the dielectric matrix 210 has an outer surface 216 that is substantially coplanar with the common plane (P in FIG. 3) of the outer surfaces 128 of the leads 120. This presents the microelectronic component assembly 200 with a relatively flat outer surface that comprises the outer surface 216 of the dielectric matrix 210 and the outer surfaces 128 of the leads 120.

If so desired, the dielectric matrix 210 may be formed integrally in a single step, e.g., via a transfer molding process. The dielectric matrix 210 shown in FIG. 6 includes a dielectric wire encapsulant 212 and an outer mold compound 214. The dielectric wire encapsulant 212 may be substantially the same as the dielectric wire encapsulant 154 discussed above in connection with FIG. 5. The dielectric wire encapsulant 212 shown in FIG. 6 leaves a portion of the terminal gap 132 unfilled and a length of each of the bond wires 140 is not covered by the dielectric wire encapsulant. This dielectric wire encapsulant 212 may be applied in a first step and the outer mold compound 214 may be applied in a second step, e.g., in a transfer molding process or using gob top techniques. If so desired, any excess dielectric matrix 210 can be removed from the outer surfaces 128 of the lead bodies 126, e.g., via etching or grinding.

The microelectronic component assembly 200 of FIG. 6 also includes an array of conductive structures 220. Each of the conductive structures 220 is carried on and is in electrical contact with the outer surface 128 of one of the leads 120. In FIG. 6, these conductive structures are typified as solder balls. Other suitable conductive structures may include conductive epoxy bumps or pillars, conductor-filled epoxy, or an anisotropic "Z-axis" conductive elastomer. These conductive structures 220 may be used to electrically connect the leads 120 of the microelectronic component assembly 200 to another microelectronic component, e.g., a substrate such as a printed circuit board, using conventional flip chip or BGA techniques.

In the embodiments of FIGS. 4 and 5, each of the leads 120 includes an exposed length 134 that extends laterally outwardly beyond the dielectric matrix 150 to facilitate connection of the leads to other microelectronic components. In the embodiment of FIG. 6, the leads 120 may be electrically coupled to another microelectronic component via the conductive structures 220. Accordingly, the leads 120 in this embodiment can be shorter. Although leads 120 shown in FIG. 6 extend a short distance laterally outwardly beyond the periphery of the microelectronic component 110, in another embodiment the leads 120 are trimmed so they do not protrude beyond the periphery of the microelectronic component 110, further reducing the size and profile of the microelectronic component assembly 200.

The microelectronic component assembly 200 optionally includes a protective cover 225 on the back surface 116 of the microelectronic component 110. This protective cover 225 helps protect the microelectronic component 110 during subsequent handling and manufacturing steps. The protective cover 225 may be applied as a fluid, e.g., an epoxy, or as a polymeric tape, e.g., a polyimide tape.

C. Microelectronic Component Assemblies Having Stacked Microelectronic Components The microelectronic component assemblies 100 and 200 shown in FIGS. 4 and 5, respectively, are relatively low-profile assemblies including a single microelectronic component 110. Microelectronic component assemblies in accordance with other embodiments of the invention incorporate two or more microelectronic components in a single package. One such microelectronic component assembly 300, illustrated in FIG. 7, incorporates the microelectronic component subassembly 102 shown in FIG. 3 and adds a second microelectronic component 310. The second microelectronic component 310 includes an active surface 312 bearing an array of terminals 314 and a back surface 316. The back surface 316 is juxtaposed with and oriented toward the active surface 112 of the first microelectronic component 110. The back surface 316 of the second microelectronic component 310 may be attached to the outer surfaces 128 of the lead bodies 126 by a pair of adhesive members 320. The same materials outlined above for the adhesive members 135 are likely to be suitable for the adhesive members 320.

The back surface 316 of the second microelectronic component 310 is spaced from the active surface 112 of the first microelectronic component 110 by a distance equal to the height ($H_1$ of FIG. 2) of the outer surfaces 128 of the leads 120 and the thickness of the adhesive members 320. This defines an intercomponent gap 325 between the first microelectronic component 110 and the second microelectronic component 310.

One or more third bond wires 330 may be used to electrically couple the terminals 314 of the second microelectronic component 310 to another microelectronic component, e.g., a PCB, via the leads 120. Each of the third bond wires 330 shown in FIG. 7 includes a terminal end 332 attached to one of the terminals 314 and a lead end 334 attached to one of the leads 120. In one embodiment, at least one of the leads 120 is connected at its inner length 122 to the first microelectronic component 110 by a bond wire 140 and has a third bond wire 330 attached to its outer surface 128. This provides a pathway for electrical communication between the first and second microelectronic components 110 and 310.

Figure 7:
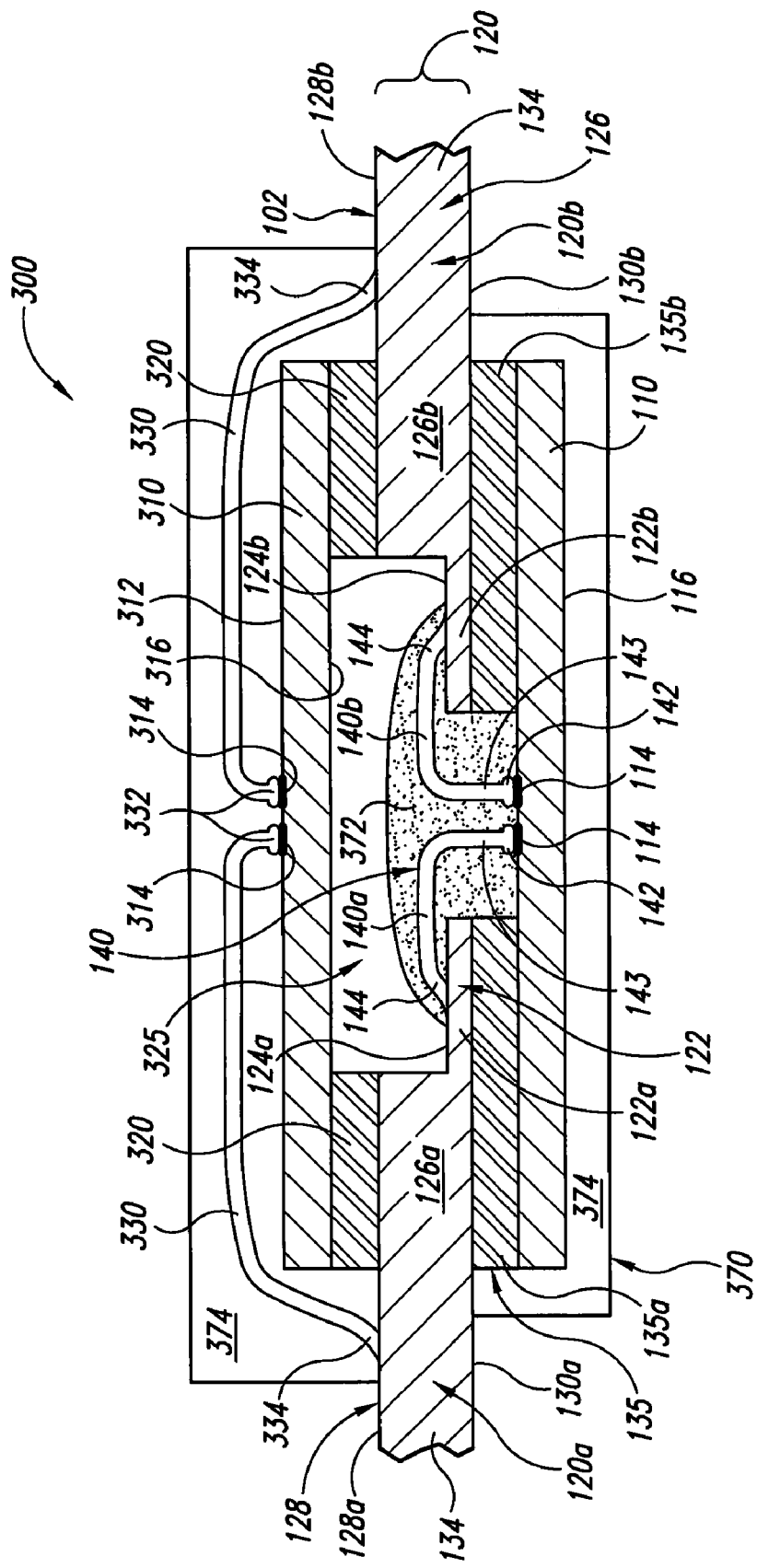
FIG. 7 is a schematic cross-sectional view of a stacked microelectronic component assembly of still another embodiment of the invention.

The microelectronic component assembly 300 shown in FIG. 7 also includes a dielectric matrix 370 that covers the first microelectronic component 110, the second microelectronic component 310, the bond wires 140 and 330, and a covered length of each of the leads 120. This dielectric matrix 370 may be formed of much the same materials and in much the same fashion as the dielectric matrix 150 of FIG. 4 or FIG. 5. The dielectric matrix 370 shown in FIG. 7 includes a dielectric wire encapsulant 372 that extends outwardly from the active surface 112 of the first microelectronic component 110 no farther than the common plane (P in FIG. 3) of the outer surfaces 128 of the leads 120. This dielectric wire encapsulant 372 is directly analogous to the dielectric wire encapsulants 154 and 212 discussed previously. The remainder of the intercomponent gap 325 may be filled with a mold compound 374 that also covers the rest of the structures noted above. This mold compound 374 may be delivered to the intercomponent gap 325 in a single transfer molding operation that also delivers the rest of the mold compound 374 to encapsulate the remainder of the noted elements.

Figure 8:
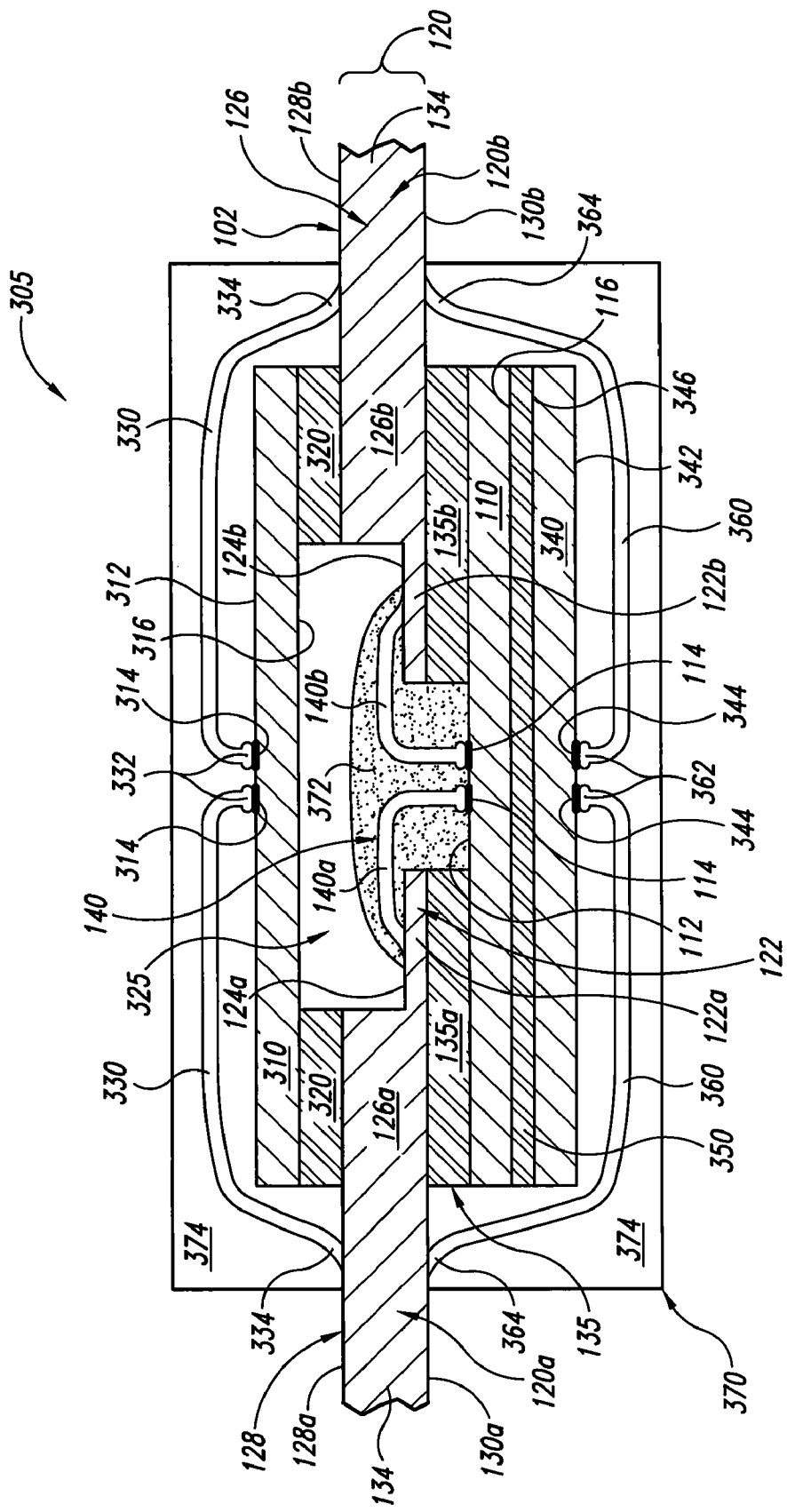
FIG. 8 is a schematic cross-sectional view of a stacked microelectronic component assembly in accordance with an alternative embodiment of the invention.

FIG. 8 schematically illustrates a microelectronic component assembly 305 in accordance with another embodiment of the invention. This microelectronic component assembly 305 may include all of the elements shown in FIG. 7 and like reference numbers are used in FIGS. 7 and 8 to indicate like elements. The microelectronic component assembly 305 also includes a third microelectronic component 340. This third microelectronic component 340 has an active surface 342 carrying an array of terminals 344. A back surface 346 of the third microelectronic component 340 may be attached to the back surface 116 of the first microelectronic component 110 by an adhesive member 350. This adhesive member 350 may be formed from the same types of material suitable for the adhesive members 135 and 320 noted previously. In one embodiment, the adhesive members 135 and 320 comprise lengths of die attach tape, but the adhesive member 350 is applied as a flowable material such as a curable dielectric epoxy that can flow when squeezed between the two microelectronic components 110 and 340.

The third microelectronic component 340 may be electrically coupled to the leads 120 by fourth bond wires 360. These bond wires 360 have a terminal end 362 attached to one of the terminals 344 and a lead end 364 attached to the confronting surface 130 of one of the leads 120. If so desired, each of the leads 120 may be connected to no more than one of the microelectronic components 110, 310 and 340. In another embodiment, though, at least one of the leads is connected to two or more of these microelectronic components 110, 310 and 340. If so desired, one of the leads 120 can be connected to the first microelectronic component 110 by a bond wire 140, connected to the second microelectronic component 310 by another bond wire 330, and connected to the third microelectronic component 340 by yet another bond wire 360. This single lead 120 would permit electrical communication between all three of the microelectronic components 110, 310 and 340.

The microelectronic component assembly 305 also includes a dielectric matrix 370. This dielectric matrix 370 is large enough to encompass not only the first and second microelectronic components 110 and 310, but also encompasses the third microelectronic component 340 and the fourth bond wires 360. This presents a single package that can incorporate three separate microelectronic components 110, 310 and 340. This can be used, for example, to provide a high density memory package, in which each of the microelectronic components may comprise the same type of memory element, e.g., SIMM, DRAM, or flash memory.

As discussed above, having the bond wires 140 recessed below the common plane P of the outer surfaces 128 of the leads 120 provides a thinner, more compact microelectronic component subassembly 102. This, in turn, allows the production of appreciably thinner microelectronic component assemblies (e.g., 300 or 305) incorporating multiple microelectronic components.

D. Alternative Microelectronic Component Assemblies Employing Reduced-Thickness Lead Frames In the microelectronic component assembly 100 of FIG. 4, a confronting back surface 130 of each of the leads 120 is attached to the active surface 112 of the microelectronic component 110 and the entire thickness of the microelectronic component 110 is spaced from each of the leads 120 by the thickness of the adhesive members 135. By employing bond wires 140 with a maximum height (L in FIG. 3) no greater than the height ($H_1$ in FIG. 3) of the common plane P, the overall thickness of the particular microelectronic component assembly 100 shown in FIG. 4 can be reduced.

Figure 9:
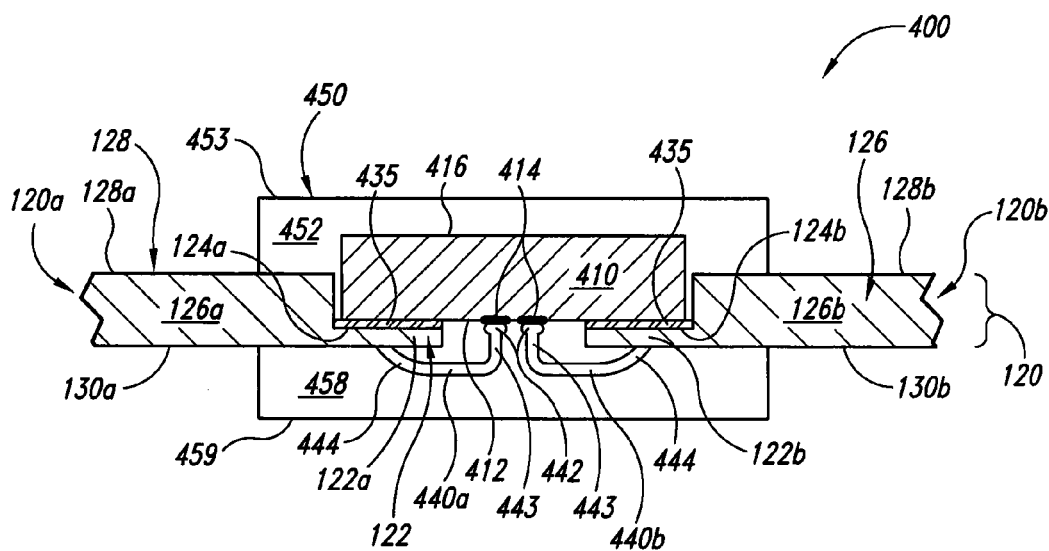
FIG. 9 is a schematic cross-sectional view of a microelectronic component assembly in accordance with an alternative embodiment of the invention.
Figure 10:
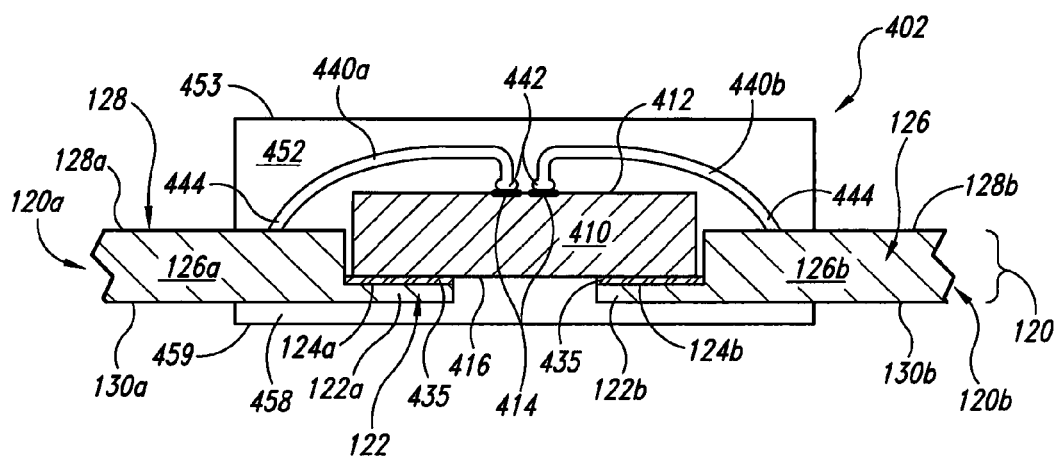
FIG. 10 is a schematic cross-sectional view of a microelectronic component assembly in accordance with a further embodiment of the invention.

FIGS. 9 and 10 illustrate reduced-thickness microelectronic component assemblies in accordance with alternative embodiments. In each of these embodiments, a portion of the thickness of a microelectronic component is received within a thickness of each of the leads, thereby reducing the overall thickness of the microelectronic component assembly.

Turning first to FIG. 9, the microelectronic component assembly 400 shown therein employs a first set of leads 120a and a second set of leads 120b. These leads 120 may be substantially the same as those discussed above in connection with FIGS. 2-4, for example, and like reference numbers are used in FIG. 9.

The microelectronic component assembly 400 includes a microelectronic component 410 having a back surface 416, an active surface 412, and an array of terminals 414 carried on the active surface 412. The microelectronic component 410 has a thickness between its back surface 416 and active surface 412 that is greater than the step height ($H_S$ in FIG. 2) of each of the leads 120.

In the embodiment of FIGS. 3 and 4, the confronting surface 130 of each of the leads 120 is attached to the microelectronic component 110 by an adhesive member 135 and each of the bond wires 140 extends between a terminal 114 of the microelectronic component 110 and a bond surface 124 of one of the leads 120. In the application of FIG. 9, however, the bond surface 124 of each of the leads functions as a mounting surface and the confronting surface 130 of each of the leads 120 functions as a back surface. In particular, the active surface 412 of the microelectronic component 410 may be attached to the mounting surface 124 of each of the leads 120 by an adhesive. In the illustrated embodiment, the mounting surface 124a of each of the first leads 120a is attached to the active surface 412 of the microelectronic component 410 by a first adhesive member 135a and the mounting surface 124b of each of the second leads 120b may be attached to the active surface 412 of the microelectronic component 410 by a second adhesive member 135b. In one embodiment, each of the adhesive members 135 comprises a length of a conventional die-attached tape. In another embodiment, each of the adhesive members 135 comprises a thickness of a thermoplastic resin or a curable epoxy. In one embodiment, these adhesive members 435 have a thickness which is less than the step height ($H_S$) in FIG. 2 of each of the leads 120. In the particular embodiment illustrated in FIG. 9, each of the adhesive members 435 has a thickness that is substantially less than the step height $H_S$. In one particular implementation, each of the adhesive members 435 has a thickness of about 1 mil for a lead 120 having a step height $H_S$ of 3 mils.

The microelectronic component assembly 400 also includes at least two bond wires 440, with each bond wire electrically coupling one of the terminals 414 of the microelectronic component 410 to the back surface 130 of one of the leads 120. Hence, a first bond wire 440a may have a terminal end 442 bonded to one of the terminals 414 of the microelectronic component 410 and a lead end 444 that is attached to the back surface 130a of the first lead 120a. Similarly, a second bond wire 440b has a terminal end 442 attached to another one of the terminals 414 of the microelectronic component 410 and has a lead end 444 that is attached to the back surface 130b of the second lead 120b. A terminal length 443 of each of the bond wires 440 may be positioned in a gap between the inner ends of the leads 120 and extend to a height outwardly from the active surface 412 at least as great as the thickness of the inner length 122 of the lead 120 to which it is attached.

In the illustrated embodiment, the outer surfaces 128 of the leads 120 are generally coplanar within a common outer plane and the back surfaces 130 of the leads 120 are generally coplanar within a common back plane. The active surface 412 of the microelectronic component 410 is positioned between these two planes. The back surface 416 of the microelectronic component 410 is spaced outwardly from the outer surfaces 128 of the leads 120. Consequently, at least a portion of the microelectronic component 410 is received within the step height $H_S$ of each of the leads 120 and the overall thickness of the combination of the leads 120 and the microelectronic component 410 is reduced as compared to conventional lead-on-lead chip systems such as that shown in FIG. 1.

The microelectronic component assembly 400 of FIG. 9 also includes a dielectric matrix 450 that covers the bond wires 440, the microelectronic component 410, and a portion of each of the leads 120, leaving an exposed portion of each of the leads 120 extending laterally outwardly from the dielectric matrix 150. A first portion 452 of the dielectric matrix 450 defines a front surface 453 of the assembly 400 and a second portion 458 of the dielectric matrix 150 defines a back surface 459 of the assembly 400. These first and second portions 452 and 458 may be formed during the same manufacturing step or in separate manufacturing steps. The materials used for the dielectric matrix 450 may be similar to those discussed above for the dielectric matrix 150 of the microelectronic component assembly 100 shown in FIG. 4.

FIG. 10 illustrates a microelectronic component 402 in accordance with an alternative embodiment of the invention. Many of the elements in FIG. 10 are shared in the microelectronic component assembly 400 of FIG. 9 and like reference numbers are used in both drawings to indicate like components. One of the differences between the microelectronic component assemblies 400 and 402 is the orientation of the microelectronic component 410 with respect to the leads 120. In FIG. 9, the active surface 412 of the microelectronic component 410 is juxtaposed with and attached to the mounting surface 124a of the leads 120. In the embodiment of FIG. 10, the microelectronic component 410 is inverted, with the active surface 412 oriented to face outwardly in the same direction as the outer surfaces 128 of the leads 120. The back surface 416 of the microelectronic component 410 is disposed between the outer plane containing the lead outer surfaces 128 and the back plane containing the lead back surfaces 130. Each of the bond wires 440 connects one of the terminals 414 of the microelectronic component 410 to the outer surface 128 of the one of the leads 120 rather than to the back surface 130 of the lead 120 as in FIG. 9.

E. Microelectronic Component Assemblies having Stacked Microelectronic Components and Multi-Stepped Leads.

Figure 11:
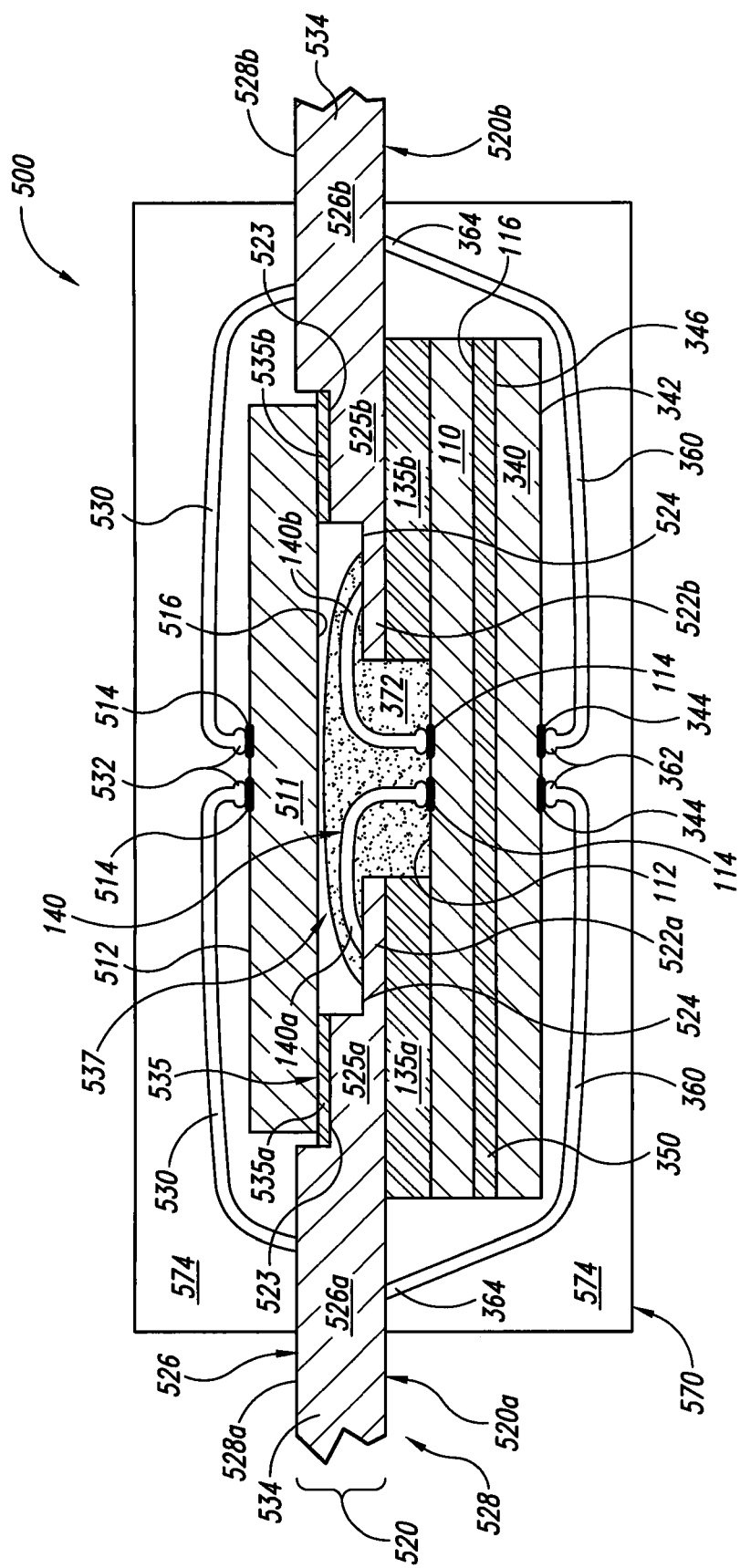
FIG. 11 is a schematic cross-sectional view of a stacked microelectronic assembly in accordance with yet another embodiment of the invention.

Aspects of some of the embodiments outlined above may be combined to yield alternative reduced-height electronic component assemblies with stacked microelectronic components. FIG. 11 schematically illustrates one such microelectronic component assembly.

The microelectronic component assembly 500 shown in FIG. 11 is similar in some respects to the microelectronic component assembly 305 shown in FIG. 8 and like reference numbers are used in FIGS. 8 and 11 to indicate like elements. The leads 120 in the microelectronic component assembly 305 of FIG. 8 have a single change in thickness between the body 126 and the inner length 122. The microelectronic component assembly 500 of FIG. 11 employs leads 520 with two or more changes in thickness along the length of the lead 520. Hence, the microelectronic component assembly 500 includes a set of first leads 520a having a body 526a, an inner length 522a, and an intermediate length 525a disposed between the body 526a and the inner length 522a. The microelectronic component assembly 500 also includes a set of second leads 520b, each of which has an inner length 522b, an intermediate length 525b, and an elongate body 526b. The inner length 522 of each of the leads 520 has a bond surface 524 similar to the bond surface 124 of leads 120. Each of the intermediate lengths 525 may define a mounting surface 523. The bond surface 524, mounting surface 523, and outer surface 528 (528a and 528b being shown in FIG. 11) may all be oriented in generally the same direction (outwardly away from the first microelectronic component 110 in FIG. 11).

In the illustrated embodiment, the intermediate length 525 of each of the leads 520 has a thickness that is greater than the thickness of the inner length 522, but less than the thickness of the body 526 of the same lead. Consequently, the mounting surface 523 of each of the leads is disposed at a mounting height outwardly from the active surface 112 of the first microelectronic component 110 that is greater than the corresponding height of the bond surface 524 with respect to the microelectronic component active surface 112, but less than the height of the lead outer surfaces 528 outwardly from the active surface 112.

The microelectronic component assembly 500 includes a second microelectronic component 511 having an active surface 512, which bears an array of terminals 514, and a back surface 516. The active surface 512 is oriented away from the first microelectronic component 110, whereas the back surface 516 is juxtaposed with, but spaced from, the active surface 112 of the first microelectronic component 110. The back surface 516 of the second microelectronic component may be attached to the mounting surfaces 523 of the leads 520 by two or more adhesive members 535a and 535b. These adhesive members 535 may be formed of materials similar to those discussed above in connection with the adhesive members 435 of the microelectronic component assembly 400 in FIG. 9. In one embodiment, the adhesive members 535 each have a thickness that is less than the difference in height between the mounting surface 523 and outer surface 528 of the lead 520 to which it is attached. As a consequence, the back face 516 of the second microelectronic component 511 may be positioned at a height outwardly from the first microelectronic component active surface 112 that is less than the corresponding height of the lead outer surfaces 528. In one embodiment, the mounting surfaces 523 may all be at least substantially coplanar, juxtaposing the back surface 516 of the second microelectronic component 511 generally parallel to the active surface 112 of the first microelectronic component 110.

The bond wires 140 connecting the terminals 114 of the first microelectronic component 110 to the bond surfaces 524 of the lead inner lengths 522 have a maximum height outwardly from the first microelectronic component active surface 112 that is no greater than the height of the back surface 516 of the second microelectronic component 511 from the same active surface 112. More desirably, each of the first set of bond wires 140 has a height less than the height of the second microelectronic component back surface 516 to avoid direct contact between the bond wires 140 and the second microelectronic component 511. In one embodiment, each of the first set of bond wires 140 has a maximum height outwardly from the active surface 112 which is no greater than the height of the mounting surfaces 523 of the leads 520. This will leave a manufacturing tolerance at least as great as the thickness of the adhesive members 535 joining the second microelectronic component 511 to the leads 520.

In one embodiment, a dielectric wire encapsulant 372 may be disposed in the intercomponent gap 537 between the first and second microelectronic components 110 and 511. In the illustrated embodiment, the dielectric wire encapsulant 372 has a maximum height outwardly from the active surface 112 that is less than the height of the back surface 516 of the second microelectronic component 511. In another embodiment, the dielectric wire encapsulant 372 may substantially fill the intercomponent gap 537.

The terminals 514 of the second microelectronic component 511 may be coupled to one or more of the leads 520 by one or more second bond wires 530. In the illustrated embodiment, a terminal end 532 of each of the second bond wires 530 may be attached to one of the terminals 514 of the second microelectronic component and an opposite end of each of the second bond wires 530 may be attached to the outer surface 528 of one of the leads 520. In the illustrated embodiment, the active surface 512 of the second microelectronic component 511 is spaced a height outwardly from the active surface 112 of the first microelectronic component 110 that is greater than the corresponding height of the outer surfaces 528 of the leads 520. By positioning the back surface 516 of the second microelectronic component 511 below the outer surfaces 528 of the leads 520, this can still reduce the height of the microelectronic component assembly 500 as compared to the microelectronic component assembly 305 shown in FIG. 8, wherein the back surface 316 of the second microelectronic component 310 is spaced outwardly from the lead outer surfaces 128 by the thickness of the adhesive members 320.

The microelectronic component assembly 500 may also include a dielectric matrix 570 that covers the first microelectronic component 110, the second microelectronic component 511, the third microelectronic component 340, the bond wires 140, 360, and 530, and a covered length of each of the leads 520. The dielectric matrix 570 may be formed of much the same materials and in much the same fashion as the dielectric matrix 150 of FIG. 4, for example. The dielectric matrix 570 desirably includes a mold compound 574, which may substantially fill the intercomponent gap 537. If a dielectric wire encapsulant 372 is employed, the mold compound 574 may substantially fill any remaining portion of the intercomponent gap 537 that is not filled with the dielectric wiring caps 372. An exposed portion 534 of each of the leads 520 may extend laterally outwardly from the dielectric matrix 570.

F. Methods of Manufacturing Microelectronic Component Assemblies

As noted above, other embodiments of the invention provide methods of manufacturing microelectronic component assemblies. In the following discussion, reference is made to the particular microelectronic component assemblies shown in FIGS. 2-8. It should be understood, though, that reference to these particular microelectronic component assemblies is solely for purposes of illustration and that the method outlined below is not limited to any particular microelectronic component assembly shown in the drawings or discussed in detail above.

In one embodiment, a method of the invention may include juxtaposing an active surface 112 of a microelectronic component 110 with leads 120 of a lead frame. Once the leads 120 are in the desired position with respect to the microelectronic component 110, the leads may be attached to the active surface 112 of the microelectronic component 110 with the array of terminals 114 extending longitudinally through the terminal gap 132. In one embodiment, this attachment is accomplished via a pair of adhesive members 135. If the adhesive members 135 each comprise a die attach tape, the first adhesive member 135a may be attached to the active surface 112 along a first longitudinal side of the array of terminals 114 and the second die attach tape 135b may be attached to the active surface 112 to extend longitudinally on the other side of the array of terminals. The leads may then be brought into contact with the outer surfaces of the adhesive members 135, thereby attaching the leads 120 to the microelectronic component 110.

In one embodiment, at least two bond wires 140 are used to electrically couple the microelectronic component 110 to selected ones of the leads 120. Using a conventional, commercially available wire bonding machine, a terminal end 142 of a first wire bond 140a may be attached to one of the terminals 114 of the microelectronic component 110 and the lead end 144 of the first bond wire 140a may be bonded to the bond surface 124 of one of the first leads 120a. In a similar fashion, a second bond wire 140b may be attached to a second terminal 114 of the microelectronic component 110 and to the bond surface 124 of one of the second leads 120b. In one embodiment, each of the bond wires 140 has a maximum height outwardly from the active surface 112 of the microelectronic component 110 that is less than the height $H_1$ of the lead outer surface 128.

A dielectric matrix 150 may be used to protect the microelectronic component subassembly 102. In the embodiment shown in FIG. 4, the microelectronic component subassembly 102 may be positioned in a transfer mold with the microelectronic component 110 and the bond wires 140 positioned in a mold cavity. A molten dielectric resin may then be delivered under pressure to fill the mold cavity, yielding a dielectric matrix 150 such as that shown in FIG. 4.

In the embodiment shown in FIG. 5, the dielectric wire encapsulant 154 may be applied before the rest of the dielectric matrix 150. In one particular embodiment, the dielectric wire encapsulant 154 is delivered as a flowable resin that can flow beneath and around the bond wires 140. In one implementation, a relatively small quantity of the dielectric wire encapsulant 154 is delivered, covering only the terminal length 143 of each of the bond wires 140 and leaving a remainder of each of the bond wires 140 exposed. In another implementation, sufficient dielectric wire encapsulant 154 is delivered to cover the entire length of each of the bond wires 140 and a portion of the bond surface 124 of each of the leads 120. As noted previously, this dielectric wire encapsulant 154 may be applied so it has a maximum height outwardly from the active surface 112 that is no greater than the height $H_1$ of the outer surfaces 128 of the leads 120. Thereafter, the outer mold compound 155 may be applied over the dielectric wire encapsulant 154, e.g., using a conventional transfer molding operation.

To form the microelectronic component assembly 200 shown in FIG. 6, the outer surface 216 of the dielectric matrix 210 may be formed at a height no higher than the common plane P of the outer surfaces 128 of the lead bodies 126. As noted previously, the matrix outer surface 216 may be substantially coplanar with the common plane P. This can be accomplished by using a mold having a mold surface that is in direct contact with the outer surfaces 128 of the lead bodies 126. If necessary, any inadvertent flash coating of the dielectric matrix 210 on the outer surfaces 128 of the leads 120 may be removed by etching or grinding. The conductive structures 220 may be applied to some or all of the outer surfaces 128 of the leads 120 to define an array of conductive structures 220. The conductive structures 220 may be deposited using a solder mask/etch process, screen printing, or any of a number of other conventional techniques used in depositing solder balls, conductive epoxies, and other conductive structures. If so desired, a protective cover 225 may be applied to the back surface 116 of the microelectronic component 110, e.g., by applying a polyimide tape or the like having an adhesive on one face to the back surface 116.

In forming a multi-component microelectronic component assembly 300 such as that shown in FIG. 7, the back surface 316 of the second microelectronic component 310 may be attached to the outer surfaces 128 of the leads 120 by adhesive members 320. If a dielectric wire encapsulant 372 is to be employed, this dielectric wire encapsulant 372 may be deposited in the terminal gap 132 before the second microelectronic component 310 is attached to the leads 120. Once the second microelectronic component 310 is in place, it may be electrically coupled to one or more of the leads 120 by one or more bond wires 330. The dielectric matrix 370 may then be formed about and between the first and second microelectronic components 110 and 310. In one embodiment, this is accomplished by placing the microelectronic components 110 and 310 and the leads 330 in a mold cavity of a transfer mold and delivering a molten mold compound to the cavity. This mold compound desirably substantially fills the inter-component gap 325 between the microelectronic components 110 and 310. Providing a dielectric wire encapsulant 372 may be particularly useful in this embodiment as the pressures necessary to ensure that the intercomponent gap 325 is adequately filled with the mold compound 374 may otherwise produce undo wire sweep.

Much the same technique used to produce the microelectronic component assembly 300 can be used to produce the microelectronic component assembly 305 of FIG. 8. The third microelectronic component 340 may be attached to the back surface 116 of the first microelectronic component 110 by the adhesive member 350 and coupled to the leads 120 by the bond wires 360 before the dielectric matrix 370 is applied, though. Likewise, the techniques outlined above can be used to produce the microelectronic component assemblies 400, 402, and 500 shown in FIGS. 9-11, respectively.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A method of manufacturing a microelectronic component assembly, comprising:
    juxtaposing an active surface of a microelectronic component with first and second leads, each of the first and second leads having a body having a first thickness and an inner length having a second thickness that is less than the first thickness, the first and second leads having inner ends opposed to one another across a terminal gap;
    attaching the first and second leads to the active surface of the microelectronic component with an array of terminals carried by the active surface extending longitudinally through the terminal gap and with the body of each of the first and second leads having an outer surface adjacent the inner length, wherein the outer surface is spaced a body height outwardly from the active surface of the microelectronic component;
    attaching a first bond wire to a first terminal of the array and to the inner length of the first lead, the first bond wire having a maximum height outwardly from the active surface that is less than the body height;
    attaching a second bond wire to a second terminal of the array and to the inner length of the second lead, the second bond wire having a maximum height outwardly from the active surface that is less than the body height; and
    filling the terminal gap with a dielectric matrix that has a maximum height outwardly from the active surface of the microelectronic component that is less than the body height.

2. The method of claim 1 further comprising covering at least a portion of each of the first and second bond wires with the dielectric matrix.

3. The method of claim 1 further comprising covering at least a portion of each of the first and second bond wires and the inner length of the first and second leads with the dielectric matrix.

4. The method of claim 1 further comprising completely covering each of the first and second bond wires with the dielectric matrix.

5. The method of claim 1 wherein attaching the first bond wire to the first terminal comprises attaching a terminal portion of the first bond wire to the first terminal and attaching the second bond wire to the second terminal comprises attaching a terminal portion of the second bond wire to the second terminal, the method further comprising covering the terminal portion of each of the first and second bond wires with a dielectric wire encapsulant, leaving a portion of each of the first and second bond wires exposed.

6. The method of claim 1 wherein filling the terminal gap with a dielectric matrix includes substantially filling the terminal gap with the dielectric matrix.

7. The method of claim 1 further comprising depositing a conductive structure on the outer surface of the body of the first lead.

8. The method of claim 1 wherein the microelectronic component is a first microelectronic component, the method further comprising:
    juxtaposing a back surface of a second microelectronic component with the active surface of the first microelectronic component, the second microelectronic component having a terminal-bearing active surface oriented away from the first microelectronic component; and
    attaching the second microelectronic component to the body of each of the first and second leads.

9. The method of claim 8 further comprising, after attaching the second microelectronic component to the first and second leads, electrically coupling an outer terminal on the active surface of the second microelectronic component to the outer surface of at least one of the first and second leads.

10. A method of manufacturing a microelectronic component assembly, comprising:

juxtaposing a surface of a microelectronic component with first and second leads, the individual first and second leads having (a) a first surface, (b) a body with a first thickness between the first surface and a second surface opposite the first surface, and (c) an inner length with a second thickness between the first surface and a mounting surface opposite the first surface, the second thickness being less than the first thickness;

attaching the inner lengths of the first and second leads to the surface of the microelectronic component with the bodies of the first and second leads positioned outboard and adjacent to the microelectronic component, the first and second leads having inner ends opposed to one another across a terminal gap;

attaching a first bond wire to the first lead and a first terminal on the microelectronic component;

attaching a second bond wire to the second lead and a second terminal on the microelectronic component; and filling the terminal gap with a dielectric matrix that has a maximum height outwardly from the active surface of the microelectronic component that is less than the body height.

11. The method of claim 10, further comprising covering the first and second bond wires with the dielectric matrix.

12. The method of claim 10 wherein the dielectric matrix is a first dielectric matrix, and wherein the method further comprises encapsulating the microelectronic component with a second dielectric matrix different than the first dielectric matrix.

13. The method of claim 10 wherein attaching the inner lengths of the first and second leads to the surface of the microelectronic component comprises coupling the inner lengths of the first and second leads to a back surface of the microelectronic component, the back surface being opposite an active surface of the microelectronic component.

14. The method of claim 10 wherein attaching the inner lengths of the first and second leads to the surface of the microelectronic component comprises coupling the inner lengths of the first and second leads to an active surface of the microelectronic component, the active surface having the first and second terminals and being opposite a back surface of the microelectronic component.

15. A method of manufacturing a microelectronic component assembly, comprising:

attaching first and second leads to an active surface of a semiconductor die, the individual first and second leads having a body and an inner length, the first and second leads having inner ends opposed to one another across a terminal gap, the body and the inner length of each of the first and second leads having a body height and an inner height outwardly from the active surface of the semiconductor die, respectively, wherein the inner height is less than the body height;

attaching a first bond wire to a first terminal of the semiconductor die and to the inner length of the first lead, the first bond wire having a maximum height outwardly from the active surface that is less than the first height;

attaching a second bond wire to a second terminal of the semiconductor die and to the inner length of the second lead, the second bond wire having a maximum height outwardly from the active surface that is less than the body height; and filling the terminal gap with a dielectric matrix that has a maximum height outwardly from the active surface of the microelectronic component that is less than the body height.

16. The method of claim 15 wherein filling the terminal gap with a dielectric matrix includes substantially encapsulating the first bond wire and a portion of the inner length of the first lead with the dielectric matrix.

17. The method of claim 15 wherein filling the terminal gap with a dielectric matrix includes encapsulating a portion of the first bond wire without encapsulating the inner length of the first lead with the dielectric matrix.

18. The method of claim 15 wherein the inner length of the first lead has an inner height outwardly from the active surface of the semiconductor die, and wherein filling the terminal gap with a dielectric matrix includes filling the terminal gap with the dielectric matrix such that the height of the matrix is less than the inner height.

19. The method of claim 15, further comprising depositing a solder ball on the body of the first lead.

* * * * *

UNITED STATES PATENT AND TRADEMARK OFFICE
CERTIFICATE OF CORRECTION

PATENT NO. : 7,691,680 B2  Page 1 of 1
APPLICATION NO. : 12/108396
DATED : April 6, 2010
INVENTOR(S) : Chee Peng Neo et al.

It is certified that error appears in the above-identified patent and that said Letters Patent is hereby corrected as shown below:

On the title page, item (73), in "Assignee", in column 1, line 1, delete "Technologies," and insert -- Technology, --, therefor.

In column 1, line 7-12, delete "CROSS-REFERENCE TO RELATED APPLICATION

This application claims foreign priority benefits of Singapore Application No. 200301338-0 filed Mar. 4, 2003, the entirety of which is incorporated herein by reference." and insert -- CROSS-REFERENCE TO RELATED APPLICATIONS This application is a divisional of U.S. Application No. 10/920,117 filed August 17, 2004, which is a divisional of U.S. Application No. 10/425,538 filed August 28, 2003, now U.S. Patent No. 7,057,281, which claims foreign priority benefits of Singapore Application No. 200301338-0 filed March 4, 2003, all of which are incorporated herein by reference in their entireties. --.

Signed and Sealed this

Eighth Day of June, 2010

David J. Kappos
*Director of the United States Patent and Trademark Office*